United States Patent
Lim et al.

(10) Patent No.: US 9,281,818 B2
(45) Date of Patent: Mar. 8, 2016

(54) INTERFACE CIRCUIT, AND SEMICONDUCTOR DEVICE AND LIQUID CRYSTAL DISPLAY DEVICE INCLUDING THE SAME

(75) Inventors: Sang-Hoon Lim, Seongnam-si (KR); Ji-Hyun Lee, Seoul (KR); Jae-youn Lee, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 1479 days.

(21) Appl. No.: 12/972,780

(22) Filed: Dec. 20, 2010

(65) Prior Publication Data

US 2011/0157251 A1  Jun. 30, 2011

(30) Foreign Application Priority Data

Dec. 30, 2009  (KR) .................. 10-2009-0134914

(51) Int. Cl.
| | |
|---|---|
| H03K 19/094 | (2006.01) |
| H03K 19/0175 | (2006.01) |
| H03K 19/00 | (2006.01) |
| H03K 19/0185 | (2006.01) |
| G09G 3/36 | (2006.01) |

(52) U.S. Cl.
CPC .... *H03K 19/0016* (2013.01); *H03K 19/018521* (2013.01); *G09G 3/3611* (2013.01); *G09G 2330/022* (2013.01); *G09G 2330/027* (2013.01); *G09G 2330/04* (2013.01)

(58) Field of Classification Search
None
See application file for complete search history.

(56) References Cited

U.S. PATENT DOCUMENTS

| | | | | |
|---|---|---|---|---|
| 6,002,381 | A * | 12/1999 | Tomio et al. ................... | 345/60 |
| 6,963,231 | B2 * | 11/2005 | Yang .............................. | 327/112 |
| 7,679,589 | B2 | 3/2010 | Park | |
| 7,855,593 | B2 * | 12/2010 | Azuma et al. ................. | 327/544 |
| 2006/0053314 | A1 * | 3/2006 | Hashidate ...................... | 713/300 |

FOREIGN PATENT DOCUMENTS

| | | |
|---|---|---|
| JP | 2009-059877 | 3/2009 |
| JP | 2009-182119 | 8/2009 |
| KR | 1020070071465 | 7/2007 |

* cited by examiner

*Primary Examiner* — Anh Tran
(74) *Attorney, Agent, or Firm* — Muir Patent Law, PLLC

(57) ABSTRACT

A method of reducing power consumption caused by leakage current in an interface circuit between modules that are driven by different power sources is disclosed. The interface circuit includes an output driver that operates by a first power supply voltage in a first mode and does not operate in a second mode in which the first power supply voltage is prevented from being applied, an input buffer that is operated by a second power supply voltage in the first and second modes, and a transmission line that connects an output terminal of the output driver to an input terminal of the input buffer. The interface circuit further includes a current leakage prevention circuit that prevents, in the second mode, a current leakage in the input buffer between a second power supply voltage source that supplies the second power supply voltage and a ground voltage source.

7 Claims, 10 Drawing Sheets

1

INTERFACE CIRCUIT, AND SEMICONDUCTOR DEVICE AND LIQUID CRYSTAL DISPLAY DEVICE INCLUDING THE SAME

CROSS-REFERENCE TO RELATED APPLICATIONS

This application claims the benefit of Korean Patent Application No. 10-2009-0134914, filed on Dec. 30, 2009, in the Korean Intellectual Property Office, the disclosure of which is incorporated herein in its entirety by reference.

BACKGROUND

This application relates to a method of reducing power consumption of a semiconductor device, and more particularly, to a method of reducing power consumption caused by leakage current in an interface circuit between modules that are driven by different power sources.

As much attention has been paid to systems having various functions and system portability, a major concern in system design is to develop multi-functional and low power systems. Systems, such as portable terminals, which use a battery with a limited amount of power enter a sleep mode except during normal (i.e., non-sleep mode) operation, thereby reducing consumption of the battery power. In certain situations, a signal input to a terminal may be a logic high '1' or logic low '0', and the system operates accordingly. However, if a system cannot determine whether a signal input via a particular terminal included in a system is logic high '1' or logic low '0', then the system may malfunction or there might be unnecessary power consumption. That is, if the level of the input signal approximates a logic threshold voltage that is unknown as to whether it corresponds to logic 'high''1' or logic 'low''0', then a current path may be formed between a power supply voltage source and a ground voltage source. As such, static current, i.e., leakage current, may flow between the power voltage source and the ground voltage source, thereby causing unnecessary power consumption. In particular, it is important to prevent generation of the leakage current in order to reduce power consumption in a semiconductor integrated circuit that uses a MOS transistor. Whether the leakage current can be prevented is closely related to the competitiveness of products, such as portable terminals, the power saving capability of which is considered as a major advantageous factor.

SUMMARY

The disclosed embodiments provide an interface circuit for effectively blocking internal leakage current, caused by an input signal that is in an unknown state.

The disclosed embodiments also provide a semiconductor device that includes an interface circuit for effectively blocking internal leakage current caused by an input signal that is in an unknown state.

The disclosed embodiments also provide a liquid crystal display (LCD) device that is driven by a driving device including an interface circuit for effectively blocking internal leakage current caused by an input signal that is in an unknown state.

According to an aspect of the disclosed embodiments, there is provided an interface circuit including an output driver to which a first power supply voltage is applied in a first mode and is prevented from being applied in a second mode; an input buffer to which a second power supply voltage is applied in the first and the second mode; and a transmission line for connecting an output terminal of the output driver to an input terminal of the input buffer. The interface circuit also includes a current leakage prevention circuit that prevents, in the second mode, a current leakage in the input buffer between a second power supply voltage source that supplies the second power supply voltage and a ground voltage source.

According to another aspect of the disclosed embodiments, there is provided a semiconductor device including a first module being driven by a first power supply voltage and including at least a first output driver for outputting internally processed data to outside the first module; a second module being driven by a second power supply voltage and including at least a first input buffer for receiving and buffering data received from outside the second module; a transmission line for connecting an output terminal of the first output driver to an input terminal of the first input buffer; and a power source that provides both the first and second power supply voltages to the respective first and second modules in a first mode and that does not provide the first power supply voltage to the first module in a second mode. The semiconductor device further includes at least a first current leakage prevention circuit that prevents a current leakage in the first input buffer between the second power supply voltage source and a ground voltage source in the second mode.

According to another aspect of the inventive concept, there is provided liquid crystal display system. The liquid crystal display system includes a liquid crystal display panel in which a plurality of scan lines and a plurality of data lines intersect one another crosswise, where a switching unit and a pixel electrode are disposed at each of the intersections; a memory including at least one output driver being driven by a first power supply voltage, for outputting image data stored in a cell via the at least one output driver; a driving unit including at least one input buffer being driven by a second power supply voltage, the driving unit configured to receive data stored in the memory unit via the at least one input buffer, generate at least one gray-scale voltage signal corresponding to the received data, and sequentially supplying the at least one gray-scale voltage signal to a respective at least one data line of the liquid crystal panel; and a power source that provides both the first and second power supply voltages in a first mode and does not provide the first power supply voltage in a second mode. The system further includes a circuit configured to prevent a current path from being formed between the second power supply voltage source and a ground voltage source in the second mode. In one embodiment, an output terminal of the at least one output driver is connected to an input terminal of the at least one input buffer via a transmission line.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
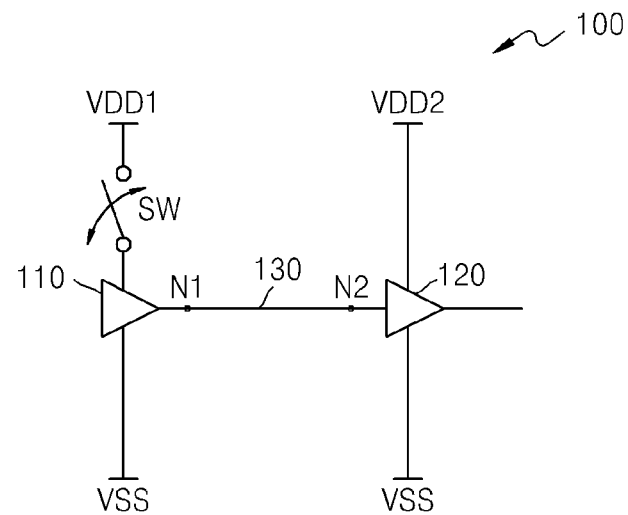
FIG. 1 is a circuit diagram of an exemplary interface circuit that includes an output driver and an input buffer at a gate level.

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two steps or figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

FIG. 1 is a circuit diagram of an interface circuit 100 including an output driver 110 and an input buffer 120. Referring to FIG. 1, the output driver 110 is operated by a first power supply voltage VDD1 and the input buffer 120 is operated by a second power supply voltage VDD2. An output terminal N1 of the output driver 110 is connected to an input terminal N2 of the input buffer 120 via a transmission line 130. The output driver 110 drives the transmission line 130 so that a signal received from a first internal block (not shown) may be received and amplified and then may be delivered to the input buffer 120. For example, the transmission line 130 may be a bus line, a clock line, or a data line. In one embodiment, the output driver 110 may be a tri-state buffer that may be in a high impedance (Hi-Z) state according to a control signal. The input buffer 120 buffers a signal received via the transmission line 130 and then outputs it to a second internal block (not shown). The interface circuit 100 has a first mode (normal mode) in which the first power supply voltage VDD1 is normally applied to the output driver 110, and a second mode (sleep mode) in which the first power supply voltage VDD1 is prevented from being applied to the output driver 110. In the second mode, the first power supply voltage VDD1 may also be prevented from being applied to other circuitry as well to conserve power, such as a memory module and other elements of a circuit connected to the output driver 110. In the first mode, a power terminal of the output driver 110 is connected to the first power supply voltage VDD1 source. In other words, power is supplied to the output driver 110, and thus, the output driver 110 is normally operative to buffer an input signal thereof. Accordingly, in the first mode, the output terminal N1 of the output driver 110 may be in a logic 'high' or 'low' state. In the second mode, the power terminal of the output driver 110 is disconnected from the first power supply voltage VDD1, such that the output terminal N1 may be floated. In other words, power is not supplied to the output driver 110, and thus, the output driver 110 does not operate. Thus, in the second mode, the output terminal N1 of the output driver 110 may be floated and may thus be in a Hi-Z state. In this case, a voltage applied to the input buffer 120 is unknown and static current (i.e., leakage current) may thus flow through the input buffer 120. That is, a voltage of signal inputted to the input buffer 120 when power is not supplied to the output driver 110 is not clearly distinguished between logic 'high' and logic 'low', thereby causing static current to flow through the input buffer 120. In this case, power consumption increases.

Figure 2:
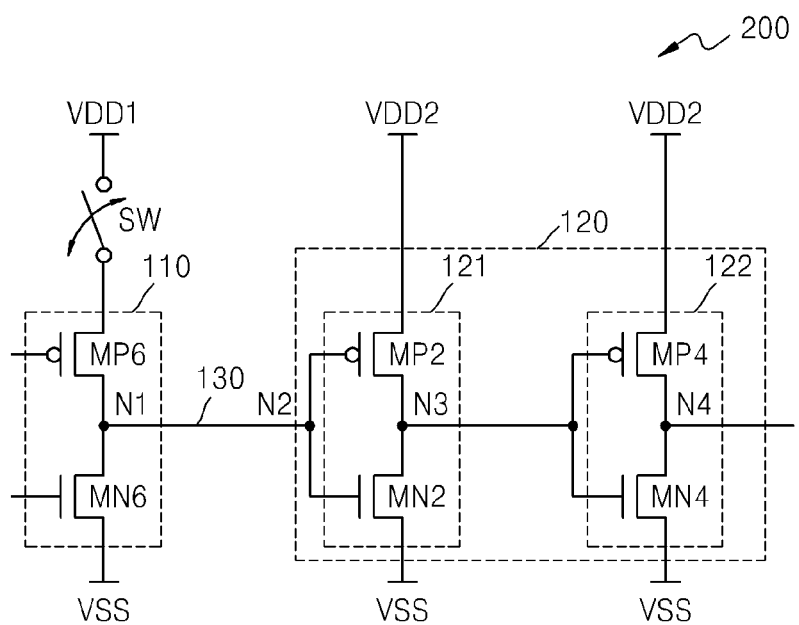
FIG. 2 is an exemplary circuit diagram representing the interface circuit of FIG. 1 at a transistor level.

FIG. 2 is an exemplary circuit diagram representing the interface circuit 100 of FIG. 1 at a transistor level. For convenience of explanation, FIG. 2 illustrates that the output driver 110 includes a pull-up transistor MP6 and a pull-down transistor MN6 that are connected in series, and that the input buffer 120 includes a first inverter 121 and a second inverter 122 connected in a cascade manner. In the first inverter 121, a PMOS transistor MP2 and a NMOS transistor MN2 are connected in series. In the second inverter 122, a PMOS transistor MP4 and a NMOS transistor MN4 are connected in series, but the disclosed embodiments are not limited thereto and could include other configurations as well.

Referring to FIG. 2, if an output voltage of the output driver 110 is logic 'high', then the NMOS transistor MN2 may be turned on and the PMOS transistor MP2 may be turned off. In this case, since the PMOS transistor MP2 is turned off, no current path is formed between a second power supply voltage VDD2 source and a ground voltage VSS source. In contrast, if the output voltage of the output driver 110 is logic 'low', then the NMOS transistor MN2 may be turned off and the PMOS transistor MP2 may be turned on. In this case, since the NMOS transistor MN2 is turned off, again no current path is formed between the second power supply voltage VDD2 source and the ground voltage VSS source. However, if the power terminal of the output driver 110 is floated, for example, first power supply voltage VDD1 is blocked, then the output voltage of the output driver 110 may be unknown and the unknown output voltage is applied to the input buffer 120 via the transmission line 130. If the unknown voltage applied to the input buffer 120 approximates a logic threshold voltage, then both the NMOS transistor MN2 and the PMOS transistor MP2 may be turned on. In this case, current path is formed between the second power supply voltage VDD2 source and the ground voltage VSS source. Thus, current flows from the second power supply voltage VDD2 source to the ground voltage VSS source via the PMOS transistor MP2 and the NMOS transistor MN2, and is undesired static (or leakage) current. Consumption of a large amount of power is caused when the total number of corresponding output drivers 110 and input buffers 120 is high.

Figure 3:
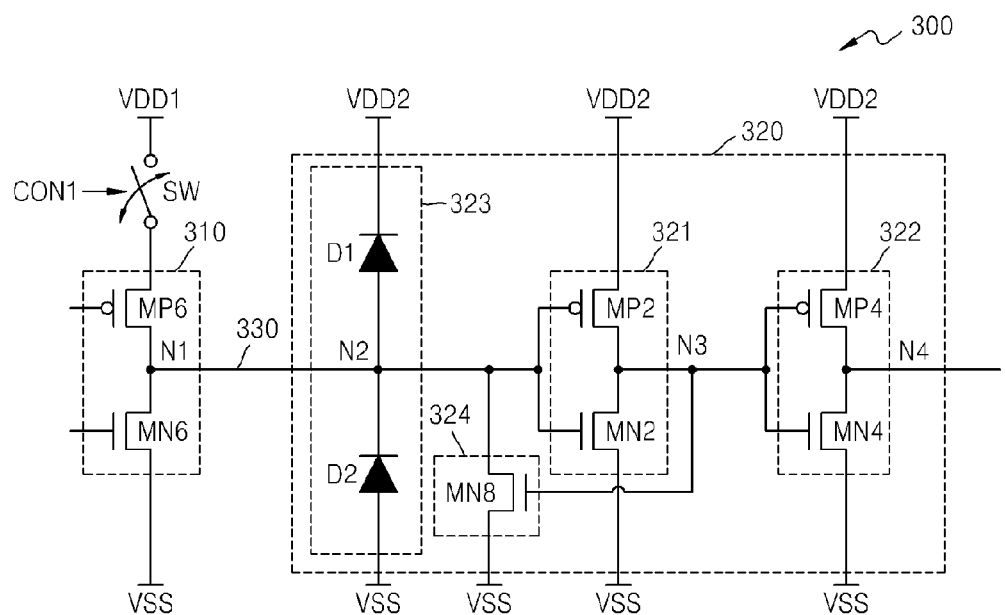
FIG. 3 is a circuit diagram of an exemplary interface circuit according to one embodiment.

FIG. 3 is an exemplary circuit diagram of an interface circuit 300 according to one embodiment. Referring to FIG. 3, the interface circuit 300 includes an output driver 310, an input buffer 320, and a transmission line 330 that connects an output terminal N1 of the output driver 310 and an input terminal N2 of the input buffer 320. The input buffer 320 includes a first inverter 321, a second inverter 322, and a current leakage prevention circuit, such as stabilizing unit 324. The current leakage prevention circuit disclosed herein reduces the leakage current flowing between a voltage source and ground. For example, during sleep mode, it may prevent a current from flowing between the voltage source and ground based on a voltage level of an unknown voltage, or it may prevent a current from flowing between the voltage source and ground regardless of the voltage level of an unknown voltage. For example, in one embodiment, the stabilizing unit 324 depicted in FIG. 3 prevents a current from flowing between VDD and VSS during a power down mode based on an unknown voltage, and thereby prevents an unknown voltage from being applied to the input terminal N2 of the input buffer 320. The stabilizing unit 324 may be an NMOS transistor MN8.

More specifically, a first control signal CON1 is set to logic 'high' in the first mode (normal mode) and to logic 'low' in the second mode (sleep mode). In other words, in the second mode, application of first power supply voltage VDD1 to the output driver 310 is discontinued, and thus, the output terminal N1 of the output driver 310 may be in a Hi-Z state and thus has an unknown voltage. The unknown voltage is applied to the input buffer 320 via the transmission line 330. If the unknown voltage is between input logic thresholds, both a PMOS transistor MP2 and an NMOS transistor MN2 of the first inverter 321 may be turned on, and thus, the first inverter 321 outputs a voltage that is a fraction of a second power supply voltage VDD2 according to an on-resistance ratio of the PMOS transistor MP2 and the NMOS transistor MN2 of the first inverter 321. If an output voltage of the first inverter 321 is greater than a threshold voltage Vth of the NMOS transistor MN8, then the NMOS transistor MN8 is turned on, thus pulling down a voltage of the input terminal N2 of the input buffer 320 to a ground voltage VSS. As the voltage of the input terminal N2 of the input buffer 320 is reduced to the ground voltage VSS, an output of the first inverter 321 is increased to the second power supply voltage VDD2, thereby causing the NMOS transistor MN8 to be turned on more strongly. As a result, the input terminal N2 of the input buffer 320 is changed to and is kept at the ground voltage VSS. In this case, the NMOS transistor MN2 is kept turned off, and thus, current path is not formed between a second power supply voltage VDD2 source and a ground voltage VSS source. Accordingly, in the interface circuit 300 according to the current embodiment, even if application of first power supply voltage VDD1 to the output driver 310 is discontinued in the second mode (sleep mode), a static (or leakage) current can be prevented from flowing from the second power supply voltage VDD2 source to the ground voltage VSS source.

The input buffer 320 may further include an electrostatic discharge (ESD) protection unit 323. In general, a semiconductor device is very sensitive to a high voltage caused by an electrostatic discharge or static electricity generated from the outside. If a high voltage is temporarily applied to a chip of the semiconductor device due to the electrostatic discharge, the high voltage destructs a thin insulating layer or a channel formed on an integrated circuit of the semiconductor device, thereby destroying the chip. A charged device model (CDM) means a discharge occurring the moment that a chip contacts the ground when a chip is accumulatively charged with static electricity during an assembly process, such as a marking process, which is a finishing process of the chip, performed by an operator or equipment. The manufacturing yield of a semiconductor device is influenced directly by a CDM charge since electric charges charged in the semiconductor device are discharged out of the semiconductor device and may destroy the semiconductor device during a manufacturing process of the semiconductor device. Therefore, there is a need to form a path in which current generated by static electricity can flow through a semiconductor device without destroying internal circuits of the semiconductor device, in consideration of a CDM that is damaged by electric charges charged in a chip. The ESD protection unit 323 of the interface circuit 300 according to the current embodiment includes a first diode D1 connected between the input terminal N2 of the input buffer 320 and the second power supply voltage VDD2 source, and a second diode D2 connected between the input terminal N2 of the input buffer 320 and the ground voltage VSS source. If a normal signal voltage is applied to the input terminal N2 of the input buffer 320, then the first and second diodes D1 and D2 are reverse-biased and thus do not conduct electric current. However, if a high voltage is applied to the input terminal N2 due to static electricity, a strong reverse bias causes a breakdown to occur in the first and second diodes D1 and D2, and thus, the first and second diodes D1 and D2 conduct electric current, thereby directly discharging electric charges to the second power supply voltage VDD2 source or the ground voltage VSS source due to the static electricity. Thus, the first and second diodes D1 and D2 prevent, for example, a gate oxide layer formed in the input buffer 320 from being destroyed. The interface circuit 300 according to the current embodiment includes the input buffer 320 having the first and second diodes D1 and D2 in consideration of a CDM and is thus strongly resistant to an ESD, thereby improving the manufacturing yield and reliability thereof.

Figure 4:
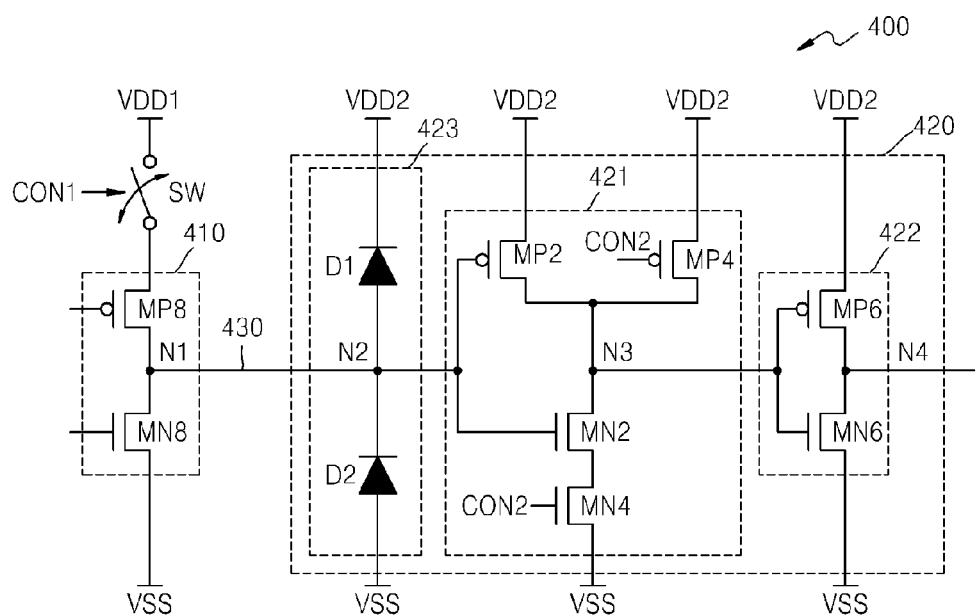
FIG. 4 is a circuit diagram of an exemplary interface circuit according to another embodiment.

FIG. 4 is an exemplary circuit diagram of an interface circuit 400 according to another embodiment. Referring to FIG. 4, the interface circuit 400 includes an output driver 410, an input buffer 420, and a transmission line 430 that connects an output terminal N1 of the output driver 410 and an input terminal N2 of the input buffer 420. The input buffer 420 includes a current leakage prevention circuit, such as blocking unit 421, and an inverter 422. In one embodiment, the blocking unit 421 prevents the current path from being formed between a second power supply voltage VDD2 source and the ground voltage VSS source regardless of a voltage at the input terminal N2 of the input buffer 420. The blocking unit 421 may be a NAND gate.

In detail, a first control signal CON1 is set to logic 'high' in the first mode (normal mode) and to logic 'low' in the second mode (sleep mode). In the second mode, application of a first power supply voltage VDD1 to the output driver 410 is discontinued, and thus the output terminal N1 of the output driver 410 may be in a Hi-Z state and has then an unknown voltage. The unknown voltage is applied to the input buffer 420 via the transmission line 430. If the unknown voltage is between input logic thresholds, both a PMOS transistor MP2 and an NMOS transistor MN2 of the NAND gate 421 may be turned on, thereby forming a current path between a second power supply voltage VDD2 source and a ground voltage VSS source. In order to prevent the current path from being formed between a second power supply voltage VDD2 source and the ground voltage VSS source, in the interface circuit 400 according to the current embodiment, a second control signal CON2 is set to logic 'low' in the second mode. The NAND gate 421 operates according to a voltage of the input terminal N2 when a second control signal CON2 is logic 'high'. When the second control signal CON2 is logic 'low', however, the NAND gate 421 pulls up an output terminal N3 thereof to a second power supply voltage VDD2 regardless of the voltage of the input terminal N2. Even if the voltage of the input terminal N2 is between the second power supply voltage VDD2 and a ground voltage VSS, an NMOS transistor MN4 is turned off as long as the second control signal CON2 is set to logic 'low', and thus, a current path is not formed between the second power supply voltage VDD2 source and the ground voltage VSS source. Thus, in the second mode, the interface circuit 400 according to the current embodiment may prevent static (or leakage) current from being generated by a current path formed between the second power supply voltage VDD2 source and the ground voltage VSS source by setting the second control signal CON2 to logic 'low' when an unknown voltage is applied to the input terminal N2 of the input buffer 420.

Also, the input buffer 420 may further include an ESD protection unit 423. The ESD protection unit 423 includes a first diode D1 connected between the input terminal N2 of the input buffer 420 and the second power supply voltage VDD2 source, and a second diode D2 connected between the input terminal N2 and the ground voltage VSS source. In one embodiment, the ESD protection unit 423 is as described above with reference to FIG. 3.

Figure 5:
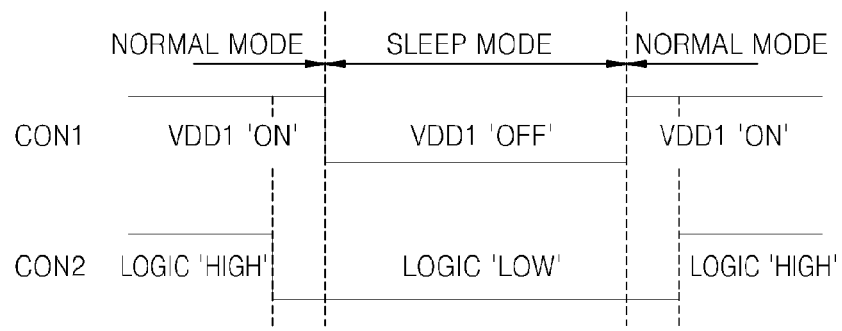
FIG. 5 is an exemplary timing diagram of a first control signal and a second control signal for controlling the interface circuit of FIG. 4, according to one embodiment.

FIG. 5 is an exemplary timing diagram of a first control signal CON1 and a second control signal CON2 for controlling the interface circuit 400 of FIG. 4, according to one embodiment. Referring to FIGS. 4 and 5, a first power supply voltage VDD1 is applied to the output driver 410 when the first control signal CON1 is logic 'high' and is prevented from being applied to the output driver 410 when the first control signal CON1 is logic 'low'. Thus, the first control signal CON1 is logic 'high' in the first mode (normal mode) and is logic 'low' in the second mode (sleep mode), and the second control signal CON2 is logic 'high' in the first mode and is logic 'low' in the second mode. The first and second control signals CON1 and CON2 may have the following relationships when the first power supply voltage VDD1 is applied to or is prevented from being applied to the output driver 410. First, if the first mode is switched to the second mode, then the second control signal CON2 may be set to logic 'low' before the application of the first power supply voltage VDD1 is prevented according to the first control signal CON1. Second, if the second mode is switched to the first mode, then the second control signal CON2 may change to logic 'high' a predetermined amount of time after the first power supply voltage VDD1 is applied according to the first control signal CON1. In one embodiment, the predetermined amounts of time may be selected based on a time needed to stabilize the first power supply voltage VDD1 applied from the output driver 410. However, in other embodiments, the first and second control signals CON1 and CON2 may be switched at the same time.

Figure 6:
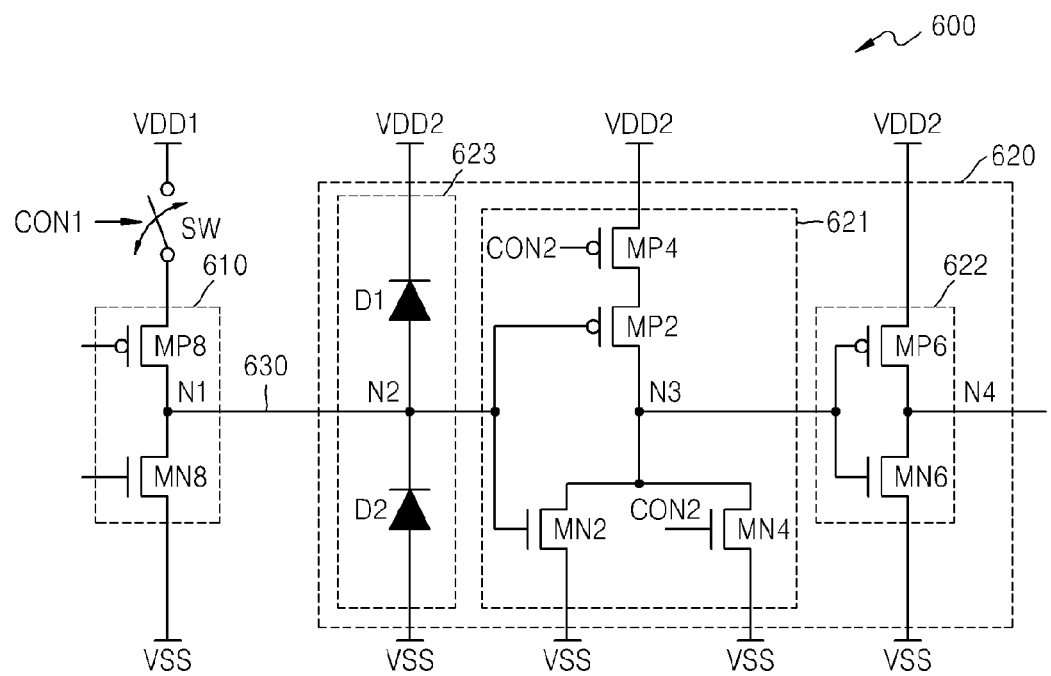
FIG. 6 is a circuit diagram of an exemplary interface circuit according to yet another embodiment.

FIG. 6 is an exemplary circuit diagram of an interface circuit 600 according to another embodiment. Referring to FIG. 6, the interface circuit 600 includes an output driver 610, an input buffer 620, and a transmission line 630 that connects an output terminal N1 of the output driver 610 to an input terminal N2 of the input buffer 620. The input buffer 620 includes a blocking unit 621 (current leakage prevention circuit) and an inverter 622. The blocking unit 621 prevents the current path from being formed between a second power supply voltage VDD2 source and the ground voltage VSS source regardless of a level of a voltage at the input terminal N2 of the input buffer 620. In one embodiment, the blocking unit 621 may be a NOR gate.

Specifically, a first control signal CON1 is set to logic 'high' in the first mode (normal mode) and to logic 'low' in the second mode (sleep mode). In the second mode, application of a first power supply voltage VDD1 to the output driver 610 is discontinued, and thus, the output terminal N1 of the output driver 610 may be in a Hi-Z state and has then an unknown voltage. The unknown voltage is applied to the input buffer 620 via the transmission line 630. If the unknown voltage is between input logic thresholds, both a PMOS transistor MP2 and an NMOS transistor MN2 of the NOR gate 621 may be turned on, thereby causing a current path to be formed between a second power supply voltage VDD2 source and a ground voltage VSS source. In order to prevent the current path from being formed between a second power supply voltage VDD2 source and the ground voltage VSS source, in the interface circuit 600 according to the current embodiment, a second control signal CON2 is set to logic 'high' in the second mode. The NOR gate 621 operates according to a voltage of the input terminal N2 when a second control signal CON2 is logic 'low'. When the second control signal CON2 is logic 'high', however, the NOR gate 621 pulls down an output terminal N3 to a ground voltage VSS regardless of the voltage of the input terminal N2. Even if the voltage of the input terminal N2 is between the second power supply voltage VDD2 and the ground voltage VSS, a PMOS transistor MP4 is turned off as long as the second control signal CON2 is set to logic 'high', thereby preventing a current path from being formed between the second power supply voltage VDD2 source and the ground voltage VSS source. Thus, in the second mode, the interface circuit 600 according to the current embodiment may prevent static (or leakage) current from being generated by a current path between the second power supply voltage VDD2 source and the ground voltage VSS source by setting the second control signal CON2 to logic 'high' when an unknown voltage is applied to the input terminal N2 of the input buffer 620.

In one embodiment, the input buffer 620 may further include an ESD protection unit 623. The ESD protection unit 623 includes a first diode D1 connected between the input terminal N2 of the input buffer 620 and the second power supply voltage VDD2 source, and a second diode D2 connected between the input terminal N2 and the ground voltage VSS source. In one embodiment, the ESD protection unit 623 functions as described above with reference to FIG. 3.

Figure 7:
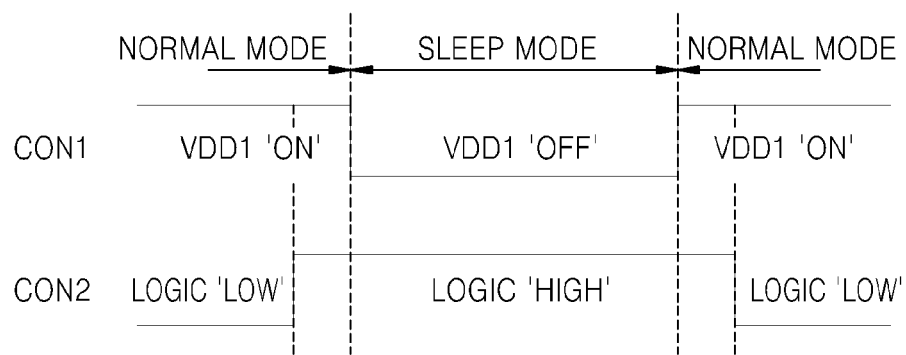
FIG. 7 is an exemplary timing diagram of a first control signal and a second control signal for controlling the interface circuit of FIG. 6, according to another embodiment.

FIG. 7 is an exemplary timing diagram of a first control signal CON1 and a second control signal CON2 for controlling the interface circuit 600 of FIG. 6, according to another embodiment. Referring to FIGS. 6 and 7, a first power supply voltage VDD1 is applied to the output driver 610 when the first control signal CON1 is logic 'high' and is prevented from being applied to the output driver 610 when the first control signal CON1 is logic 'low'. Thus, the first control signal CON1 is logic 'high' in the first mode (normal mode) and is logic 'low' in the second mode (sleep mode), whereas the second control signal CON2 is logic 'low' in the first mode and is logic 'high' in the second mode. The first and second control signals CON1 and CON2 may have the following relationships so that undesired current cannot flow when the first power supply voltage VDD1 is applied to or is prevented from being applied to the output driver 610. First, if the first mode is switched to the second mode, then the second control signal CON2 may be set to logic 'high' before the application of the first power supply voltage VDD1 is prevented according to the first control signal CON1. Second, if the second mode is switched to the first mode, then the second control signal CON2 may be set to logic 'low' a predetermined amount of time after the first power supply voltage VDD1 is applied according to the first control signal CON1. In one embodiment, the predetermined amount of time may be based on a time needed to stabilize the first power supply voltage VDD1 applied from the output driver 610. However, in other embodiments, the first and second control signals CON1 and CON2 may be switched at the same time.

Figure 8:
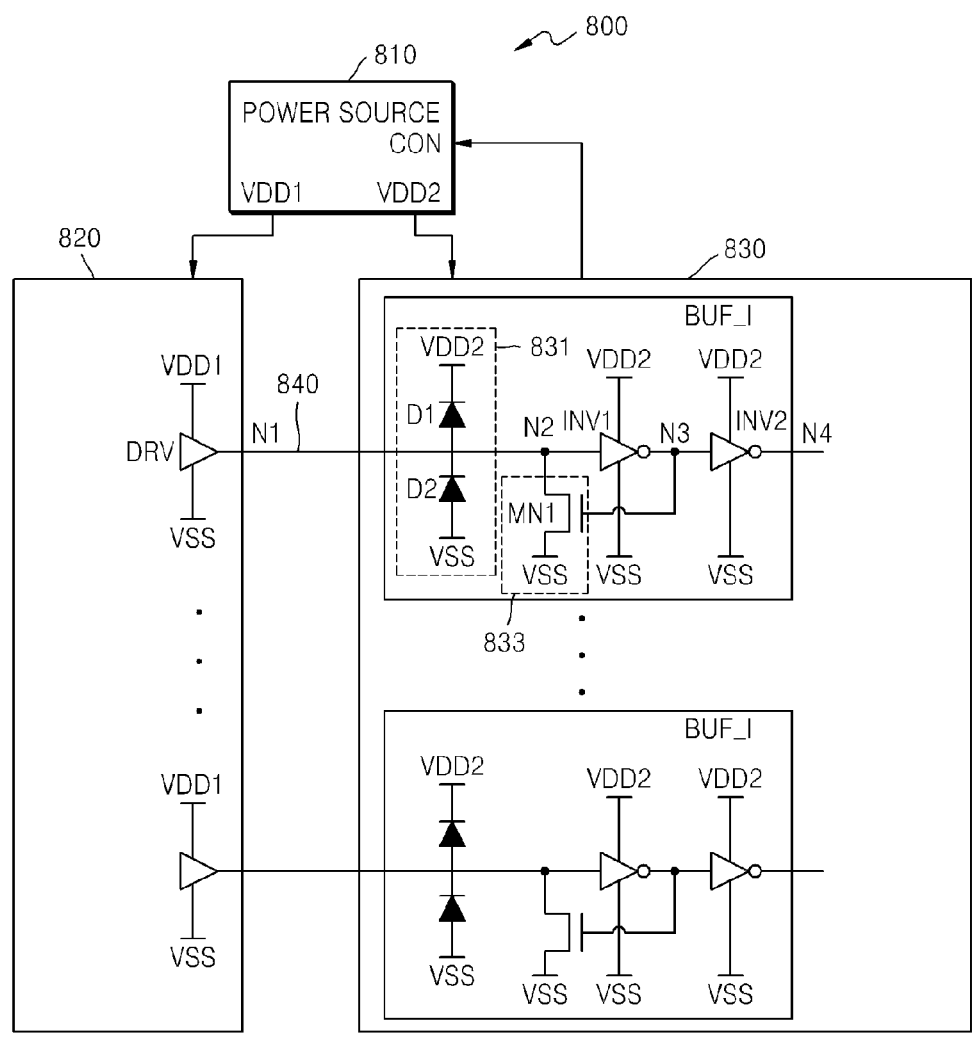
FIG. 8 is an exemplary block diagram of a semiconductor device, according to one embodiment.

FIG. 8 is an exemplary block diagram of a semiconductor device 800 according to one embodiment. Referring to FIG. 8, the semiconductor device 800 includes a power source 810 that generates a first power supply voltage VDD1 and a second power supply voltage VDD2, a first module 820 that is operated by the first power supply voltage VDD1, and a second module 830 that is operated by the second power supply voltage VDD2. The power source 810 may provide or may not provide the first power supply voltage VDD1 to the first module 820 according to a control signal CON. The first module 820 includes a first internal block (not shown) and at least one output driver DRV. The output driver DRV transmits a signal received from the first internal block (not shown) to the second module 830. The second module 830 includes at least one input buffer BUF_I and a second internal block (not shown). The at least one input buffer BUF_I buffers a signal received from the first module 820 and outputs the signal to the second internal block. An output terminal N1 of the at least one output driver DRV is connected to an input terminal N2 of the at least one input buffer BUF_I via a transmission line 840. The at least one output driver DRV drives the transmission line 840 so that a signal received from the first internal block (not shown) may be received and amplified and then be delivered to the at least one input buffer BUF_I. The at least one input buffer BUF_I includes a first inverter INV1, a second inverter INV2, and a current leakage prevention circuit, such as stabilizing unit 833. The stabilizing unit 833 prevents the unknown voltage from being applied to the input terminal N2 of the at least one input buffer BUF_I. In one embodiment, the stabilizing unit 833 may be an NMOS transistor MN1. The first inverter INV1 inverts a logic level of a signal at the input terminal N2. The second inverter INV2 inverts an output of the first inverter INV1 and supplies the result of inverting to the second internal block (not shown). A first terminal and a second terminal of the NMOS transistor MN1 are connected to the input terminal N2 and a ground voltage VSS source, respectively. The NMOS transistor MN1 is controlled according to an output of the first inverter INV1.

In detail, the control signal CON is set to logic 'high' in the first mode (normal mode) and to logic 'low' in the second mode (sleep mode). In the first mode, the power source 810 provides the first power supply voltage VDD1 to the at least one output driver DRV. In the second mode, the power source 810 does not provide the first power supply voltage VDD1 to the at least one output driver DRV. In the second mode, application of a first power supply voltage VDD1 to the at least one output driver DRV is discontinued, then the output terminal N1 of the at least one output driver DRV may be in a Hi-Z state and thus has an unknown voltage. The unknown voltage is applied to the input terminal N2 of the at least one input buffer BUF_I via the transmission line 840. As described above with reference to FIG. 3, the NMOS transistor MN1 pulls down the voltage of the input terminal N2 to a ground voltage VSS. The output of the first inverter IV1 is fed back to a gate terminal of the NMOS transistor MN1. If the output of the first inverter INV1 is greater than a threshold voltage Vth of the NMOS transistor MN1 due to the unknown voltage at the input terminal N2, the NMOS transistor MN1 is turned on, and thus the voltage of the input terminal N2 is changed to and is kept at the ground voltage VSS. In this case, the NMOS transistor (not shown) included in the first inverter INV1 is kept turned off, and thus, in the first inverter INV1 a static (or leakage) current path is not formed between a second power supply voltage VDD2 source and the ground voltage VSS source. Accordingly, in the semiconductor device 800 according to the current embodiment, if application of first power supply voltage VDD1 to the first module 820 is discontinued in the second mode, a static (or leakage) current may be prevented from flowing from the second power supply voltage VDD2 source to the ground voltage VSS source.

The at least one input buffer BUF_I may further include an ESD protection unit 831. The ESD protection unit 831 includes a first diode D1 connected between the input terminal N2 of the at least one input buffer BUF_I and the second power supply voltage VDD2 source, and a second diode D2 connected between the input terminal N2 and the ground voltage VSS source. If a normal voltage is applied to the input terminal N2 of the at least one input buffer BUF_I, then the first and second diodes D1 and D2 are reverse-biased and thus do not conduct electric current. However, if a high voltage is applied to the input terminal N2 due to static electricity, a strong reverse bias causes a breakdown to occur in the first and second diodes D1 and D2, and thus, the first and second diodes D1 and D2 conduct electric current, thereby directly discharging electric charges to the second power supply voltage VDD2 source or the ground voltage VSS source due to the static electricity. Thus, the first and second diodes D1 and D2 prevent, for example, a gate oxide layer formed on the at least one input buffer BUF_I from being destroyed. The semiconductor device 800 according to the current embodiment includes the at least one input buffer BUF_I having the first and second diodes D1 and D2 in consideration of a CDM and is thus strongly resistant to an ESD, thereby improving the manufacturing yield and reliability thereof.

Figure 9:
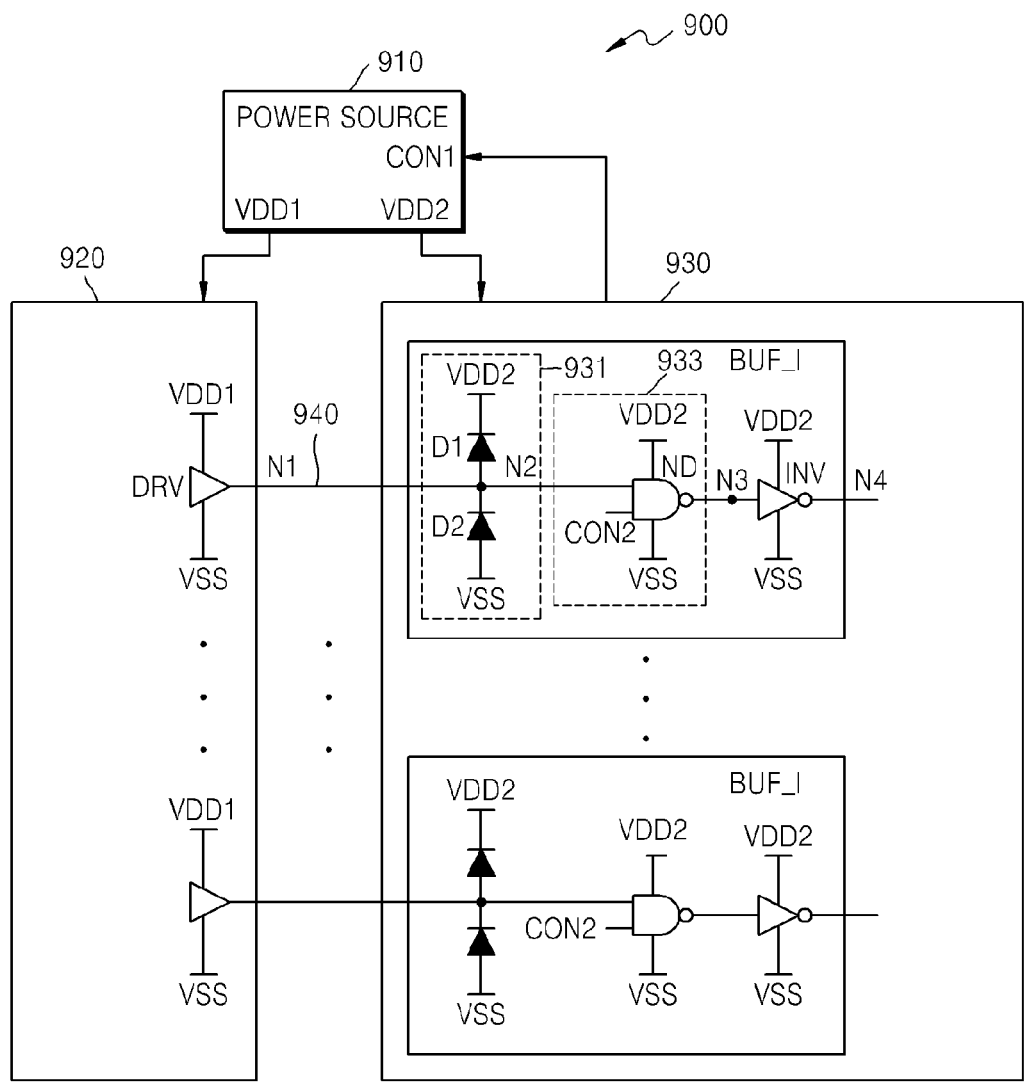
FIG. 9 is an exemplary block diagram of a semiconductor device according to another embodiment.

FIG. 9 is an exemplary block diagram of a semiconductor device 900 according to another embodiment. Referring to FIG. 9, the semiconductor device 900 includes a power source 910 that generates a first power supply voltage VDD1 and a second power supply voltage VDD2, a first module 920 that is operated by the first power supply voltage VDD1, and a second module 930 that is operated by the second power supply voltage VDD2. The power source 910 may provide or may not provide the first power supply voltage VDD1 to the first module 920 according to a first control signal CON1. The first module 920 includes a first internal block (not shown) and at least one output driver DRV. The output driver DRV transmits a signal received from the first internal block (not shown) to the second module 930. The second module 930 includes at least one input buffer BUF_I and a second internal block (not shown). The at least one input buffer BUF_I buffers a signal received from the first module 920 and outputs the signal to the second internal block (not shown). An output terminal N1 of the at least one output driver DRV is connected to an input terminal N2 of the at least one input buffer BUF_I via a transmission line 940. The at least one output driver DRV drives the transmission line 940 so that a signal received from the first internal block (not shown) may be received and amplified and then be delivered to the at least one input buffer BUF_I. The at least one input buffer BUF_I includes a current leakage prevention circuit, such as blocking unit 933, and an inverter INV. The blocking unit 933 prevents a current path from being formed between a second power supply voltage VDD2 source and the ground voltage VSS source regardless of a level of a voltage at the terminal N2 of the at least one input buffer BUF_I. In one embodiment, the blocking unit 933 may be a 2-input NAND gate ND. The NAND gate ND performs a NAND operation on a second control signal CON2 and a signal received from a transmission line 940 and then outputs the result. The inverter INV inverts and outputs the output of the NAND gate ND.

Specifically, the first control signal CON1 is set to logic 'high' in the first mode (normal mode) and to logic 'low' in the second mode (sleep mode). In the first mode, the power source 910 provides the first power supply voltage VDD1 to the at least one output driver DRV. In the second mode, the power source 910 does not provide the first power voltage VDD1 to the at least one output driver DRV. In the second mode, application of a first power supply voltage VDD1 to a first module 920 is discontinued according to the first control signal CON1, then an output terminal N1 of at least one output driver DRV may be floated and is thus in a Hi-Z state. Thus, an unknown voltage is applied to the input terminal N2 of the at least one input buffer BUF_I via the transmission line 940. An output of the at least one output driver DRV and the second control signal CON2 are supplied as a first input and a second input to the NAND gate ND, respectively. Even if the first input is an unknown voltage, the NAND gate ND always outputs a logic 'high' signal as long as the second control signal CON2 is logic 'low'. That is, if the second control signal CON2 is logic 'low', then a path in which the output of the NAND gate ND is pulled down is always blocked regardless of the logic level of the first input. Thus, a static (or leakage) current path is not formed from a second power supply voltage VDD2 source to a ground voltage VSS source via the NAND gate ND. Accordingly, it is possible to reduce power consumption in the semiconductor device 900 according to the current embodiment because static (or leakage) current is not generated in the at least one input buffer BUF_I even when power is not supplied to the first module 920.

The at least one input buffer BUF_I may further include an ESD protection unit 931. The ESD protection unit 931 prevents, for example, a gate oxide layer formed on the at least one input buffer BUF_I from being destroyed by static electricity. The ESD protection unit 931 includes a first diode D1 connected between an input terminal N2 of the at least one input buffer BUF_I and the second power supply voltage VDD2 source, and a second diode D2 connected between the input terminal N2 and the ground voltage VSS source. In one embodiment, the ESD protection unit 931 functions as described above with reference to FIG. 8.

Figure 10:
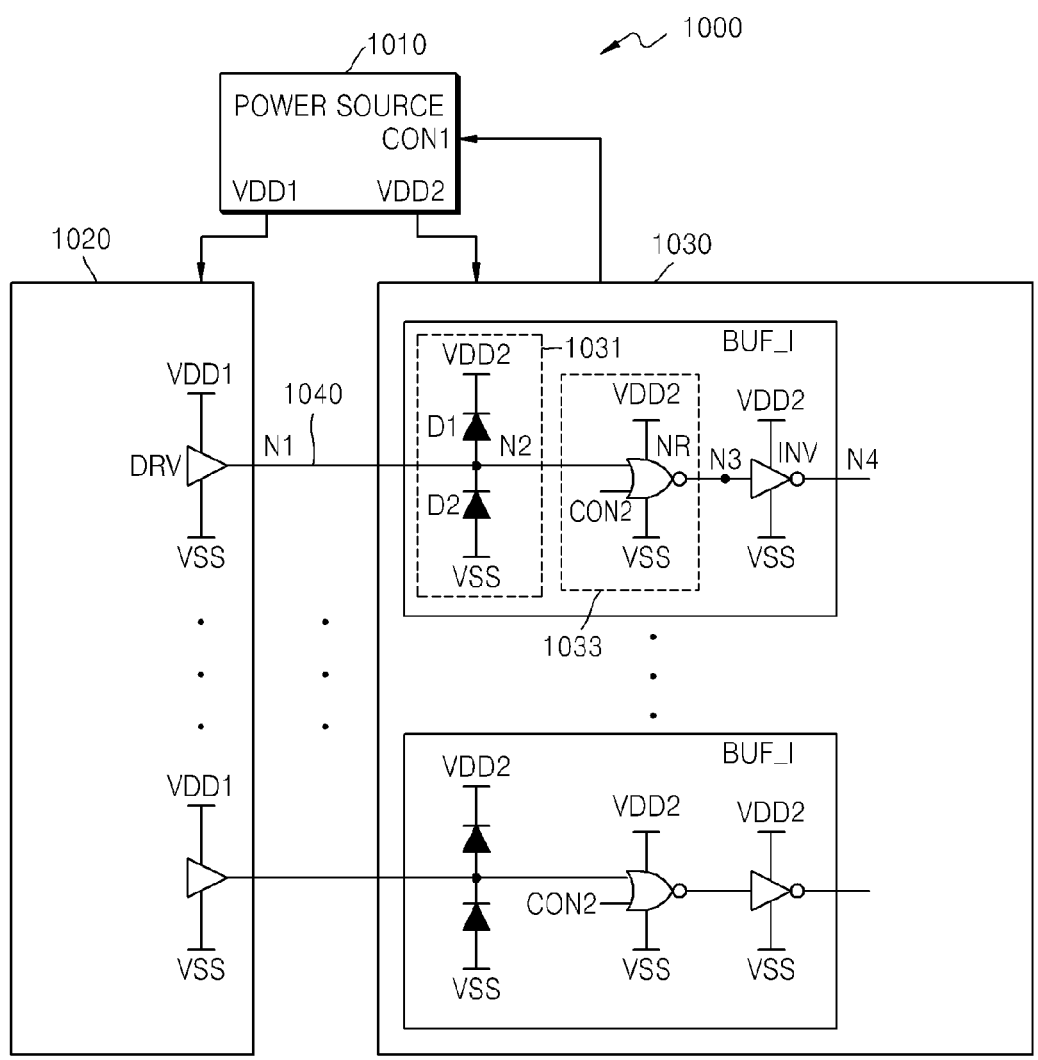
FIG. 10 is an exemplary block diagram of a semiconductor device according to yet another embodiment.

FIG. 10 is an exemplary block diagram of a semiconductor device 1000 according to another embodiment. Referring to FIG. 10, the semiconductor device 1000 includes a power source 1010 that generates a first power supply voltage VDD1 and a second power supply voltage VDD2, a first module 1020 that is operated by the first power supply voltage VDD1, and a second module 1030 that is operated by the second power supply voltage VDD2. The power source 1010 may provide or may not provide the first power supply voltage VDD1 to the first module 1020 according to a first control signal CON1. The first module 1020 includes a first internal block (not shown) and at least one output driver DRV. The output driver DRV transmits a signal received from the first internal block (not shown) to the second module 1030. The second module 1030 includes at least one input buffer BUF_I and a second internal block (not shown). The at least one input buffer BUF_I buffers a signal received from the first module 1020 and outputs the signal to the second internal block (not shown). An output terminal N1 of the at least one output driver DRV is connected to an input terminal N2 of the at least one input buffer BUF_I via a transmission line 1040. The at least one output driver DRV drives the transmission line 1040 so that a signal received from the first internal block (not shown) may be received and amplified and then be delivered to the at least one input buffer BUF_I. The at least one input buffer BUF_I includes a blocking unit 1033 and an inverter INV. The blocking unit 1033 prevents a current path from being formed between a second power supply voltage VDD2 source and the ground voltage VSS source regardless of a level of a voltage at the terminal N2 of the at least one input buffer BUF_I. In one embodiment, the blocking unit 1033 may be a 2-input NOR gate NR. The NOR gate NR performs a NOR operation on a second control signal CON2 and a signal received via a transmission line 1040 and then outputs the result. The inverter INV inverts and outputs the output of the NOR gate NR.

In detail, the first control signal CON1 is set to logic 'high' in the first mode (normal mode) and to logic 'low' in the second mode (sleep mode). In the first mode, the power source 1010 provides the first power supply voltage VDD1 to the at least one output driver DRV. In the second mode, the power source 1010 does not provide the first power voltage VDD1 to the at least one output driver DRV. In the second mode, application of a first power supply voltage VDD1 to a first module is discontinued according to the first control signal CON1, then an output terminal N1 of at least one output driver DRV may be floated and is thus in a Hi-Z state. Thus, the unknown voltage is applied to the input terminal of N2 of the at least one input buffer BUF_I via the transmission line 1040. An output of the at least one output driver DRV and the second control signal CON2 are supplied as a first input and a second input to the NOR gate NR, respectively. Even if the first input is an unknown voltage, the NOR gate NR always outputs a logic 'low' signal as long as the second control signal CON2 is logic 'high'. That is, if the second control signal CON2 is logic 'high', then a path in which the output of the NOR gate NR is pulled up is always blocked regardless of the logic level of the first input. Thus, a static (or leakage) current path is not formed from a second power supply voltage VDD2 source to a ground voltage VSS source via the NOR gate NR. Accordingly, it is possible to reduce power consumption in the semiconductor device 1000 according to the current embodiment since static (or leakage) current is not generated in the at least one input buffer BUF_I even when power is not supplied to the first module 1020.

The at least one input buffer BUF_I may further include an ESD protection unit 1031. The ESD protection unit 1031 prevents, for example, a gate oxide layer formed on the at least one input buffer BUF_I from being destroyed by static electricity. In one embodiment, the ESD protection unit 1031 includes a first diode D1 connected between an input terminal N2 of the at least one input buffer BUF_I and the second power supply voltage VDD2 source, and a second diode D2 connected between the input terminal N2 and the ground voltage VSS source. In one embodiment, the ESD protection unit 1031 functions as described above with reference to FIG. 8.

Figure 11:
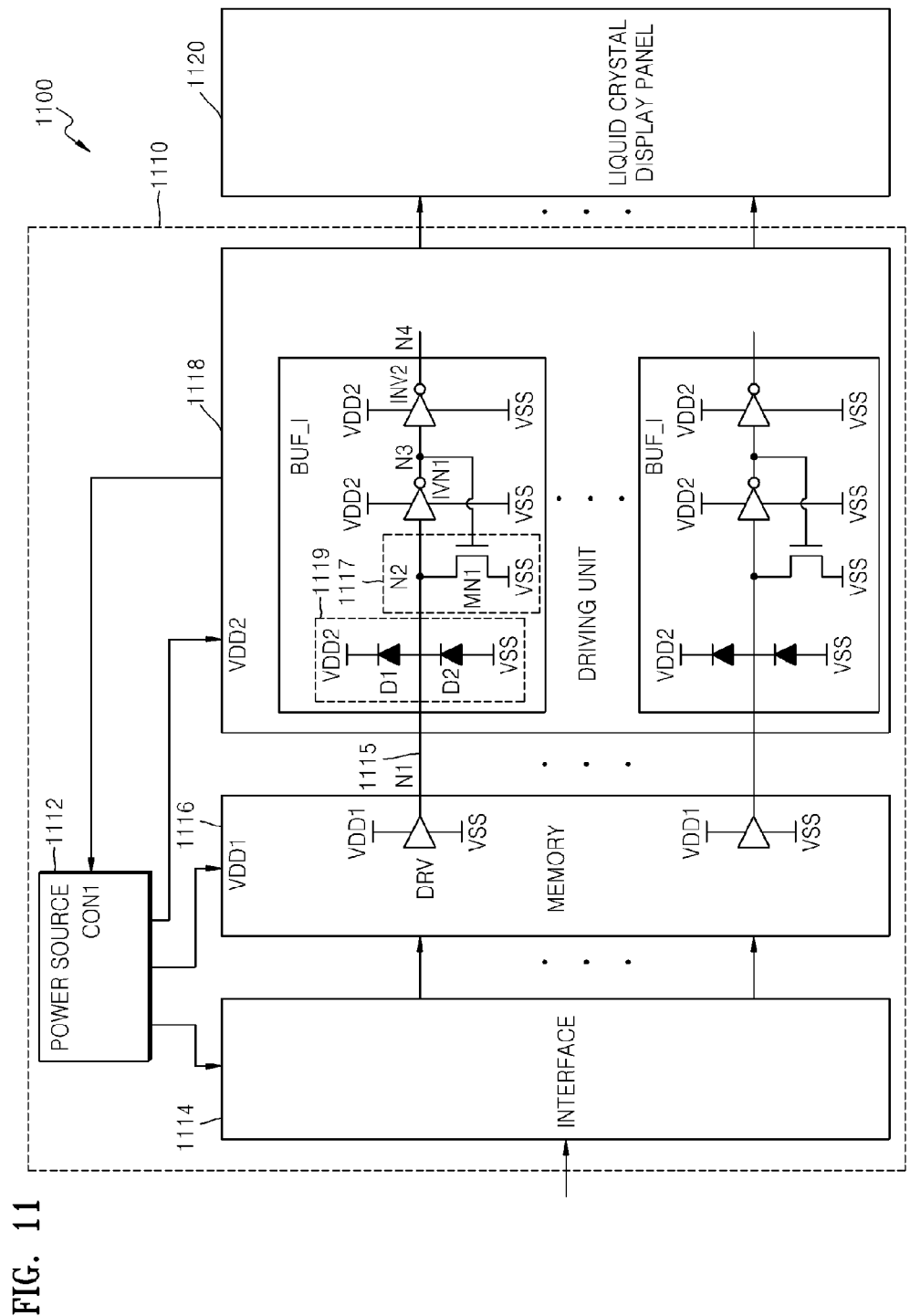
FIG. 11 is an exemplary block diagram of a liquid crystal display (LCD) device according to one embodiment.

FIG. 11 is an exemplary block diagram of a liquid crystal display (LCD) system 1100 according to one embodiment. Referring to FIG. 11, the LCD system 1100 includes a driving device 1110 and a liquid crystal display panel 1120. The driving device 1110 includes a power source 1112, an interface 1114, a memory 1116, and a driving unit 1118. The driving device 1110 supports a sleep mode. In the sleep mode, in one embodiment, only indispensable system monitoring is performed without displaying image data on the liquid crystal display panel 1120. Thus, the memory 1116 does not need to store data in the sleep mode, and thus, supply of power to the memory 1116 may be discontinued in order to reduce power consumption. An operation of the LCD system 1100 will be described briefly. The power source 1112 applies a first power supply voltage VDD1 and a second power supply voltage VDD2 to the memory 1116 and the driving unit 1118, respectively. The interface 1114 receives image data from outside the driving device 1110. The image data received via the interface 1114 is stored in the memory 1116. The interface 1114 may also transmit the image data stored in the memory 1116 to outside the driving device 1110. The driving unit 1118 reads the image data from the memory 1116 and then drives the liquid crystal display panel 1120 by generating a gray-scale voltage corresponding to the image data.

To do so, in one embodiment, the driving unit 1118 sequentially supplies a scan signal to rows of the liquid crystal display panel 1120, which sequentially turns on a plurality of switches (not shown) connected to respective electrodes in the rows to which the scan signal has been sequentially supplied are turned on sequentially. The gray-scale voltage generated by the driving unit 1118, which may include a plurality of voltage signals, is provided via a plurality of data lines that intersect crosswise with the scan lines, and is applied to liquid crystal contained in the liquid crystal display panel 1120 via the plurality of switches. A gray-scale voltage applied to a liquid crystal controls a rotation angle of the liquid crystal to adjust optical transmissivity so that an image may be displayed on the liquid crystal display panel 1120. Additional details of a liquid crystal display panel are described, for example, in U.S. Pat. No. 7,679,589, to Chul-Woo Park, which is incorporated herein by reference in its entirety.

In detail, the power source 1112 may generate the first power supply voltage VDD1 or may not generate the first power supply voltage VDD1 according to a first control signal CON1. That is, the power source 1112 supports the first mode (normal mode) in which both the first power supply voltage VDD1 and the second power supply voltage VDD2 are generated, and the second mode (sleep mode) in which only the second power supply voltage VDD2 is generated. The memory 1116 is operated by the first power supply voltage VDD1 applied from the power source 1112, and includes at least one output driver DRV for outputting image data stored in an internal cell (not shown). The at least one output driver DRV drives a transmission line 1115 so that an image data signal received from the internal cell may be received and amplified and then be delivered to the driving unit 1118. The image data stored in the memory 1116 is supplied to the driving unit 1118 via the at least one output driver DRV. The driving unit 1118 includes at least one input buffer BUF_I that receives the image data from the memory 1116 and buffers the image data. The at least one input buffer BUF_I includes a first inverter INV1, a second inverter INV2, and a current leakage prevention circuit, such as stabilizing unit 1117. The stabilizing unit 1117 prevents the unknown voltage from being applied to the input terminal N2 of the input buffer BUF_I. In one embodiment, the stabilizing unit 1117 may be an NMOS transistor MN1. The first inverter INV1 inverts and outputs an input signal received via the transmission line 1115. The second inverter INV2 inverts an output of the first inverter INV1 and supplies the result of inverting to an internal block (not shown). A first terminal and a second terminal of the NMOS transistor MN1 are connected to an input terminal N2 of the at least one input buffer BUF_I and a ground voltage VSS source, respectively. Thus, the NMOS transistor MN1 may be controlled according to an output of the first inverter INV1.

More specifically, if application of the first power supply voltage VDD1 to the at least one output driver DRV is discontinued, then an output terminal N1 of the at least one output driver DRV may be in a Hi-Z state and thus has an unknown voltage. The unknown voltage is applied to the at least one input buffer BUF_I via the transmission line 1115. As described above with reference to FIG. 3, the NMOS transistor MN1 pulls down a voltage of the input terminal N2 to a ground voltage VSS. If an output voltage of the first inverter INV1 is greater than a threshold voltage Vth of the NMOS transistor MN1 due to the unknown voltage at the terminal N2 of the at least one input buffer BUF_I, the NMOS transistor MN1 is turned on, and thus the voltage of the input terminal N2 is changed to and is kept at the ground voltage VSS. In this case, an NMOS transistor (not shown) in the first inverter INV1 is kept turned off, thereby preventing a static current path from being formed between a second power supply voltage VDD2 source and the ground voltage VSS source. Accordingly, in the LCD device 1100 according to the current embodiment, even if application of first power supply voltage VDD1 to the memory unit 1116 is discontinued in the second mode, a static (or leakage) current may be prevented from flowing from the second power supply voltage VDD2 source to the ground voltage VSS source.

The at least one input buffer BUF_I may further include an ESD protection unit 1119. The ESD protection unit 1119 includes a first diode D1 connected between the input terminal N2 of the at least one input buffer BUF_I and the second power supply voltage VDD2 source, and a second diode D2 connected between the input terminal N2 and the ground voltage VSS source. If a normal signal voltage is applied to the input terminal N2, then the first and second diodes D1 and D2 are reverse-biased and thus do not conduct electric current. However, if a high voltage is applied to the input terminal N2 due to static electricity, a strong reverse bias causes a breakdown to occur in the first and second diodes D1 and D2, and thus, the first and second diodes D1 and D2 conduct electric current, thereby directly discharging electric charges to the second power supply voltage VDD2 source or the ground voltage VSS source due to the static electricity. Thus, the ESD protection unit 1119 prevents, for example, a gate oxide layer formed on the at least one input buffer BUF_I from being destroyed. The LCD device 1100 according to the current embodiment includes the at least one input buffer BUF_I having the first and second diodes D1 and D2 in consideration of a CDM and is thus strongly resistant to an ESD, thereby improving the manufacturing yield and reliability thereof.

Figure 12:
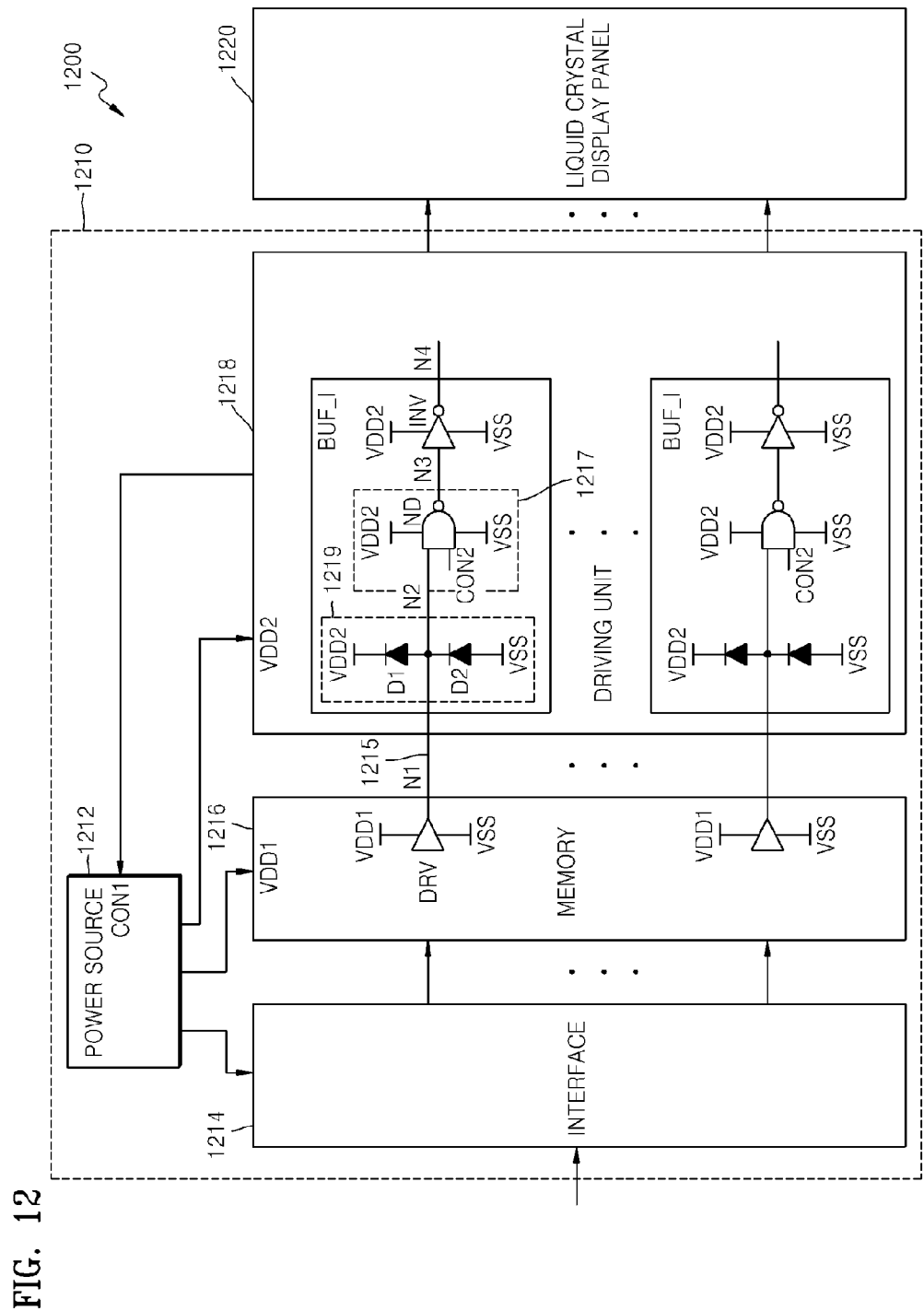
FIG. 12 is an exemplary block diagram of an LCD device according to another embodiment.

FIG. 12 is an exemplary block diagram of an LCD system 1200 according to another embodiment. Referring to FIG. 12, the LCD system 1200 includes at least one input buffer BUF_I including a current leakage prevention circuit, such as blocking unit 1217, and an inverter INV. The blocking unit 1217 prevents a current path from being formed between a second power voltage VDD2 source and the ground voltage VSS source regardless of a level of a voltage at the terminal N2 of the at least one input buffer BUF_I. The blocking unit 1217 may be a 2-input NAND gate ND. The NAND gate ND performs a NAND logical operation on a second control signal CON2 and a signal received via a transmission line 1215 and outputs the result. The inverter INV inverts and outputs an output of the NAND gate ND.

Specifically, a first control signal CON1 is set to logic 'high' in the first mode (normal mode) and to logic 'low' in the second mode (sleep mode). In the second mode, the power source 1212 does not provide the first power voltage VDD1 to the at least one output driver DRV. In other words, application of a first power supply voltage VDD1 to the memory 1216 is discontinued, then an output terminal N1 of at least one output driver DRV may be floated and is then in a Hi-Z state. Thus, in the second mode, the unknown voltage is applied to the at least one input buffer BUF_I via the transmission line 1215. The output of the at least one output driver DRV and the second control signal CON2 are supplied as a first input and a second input to the NAND gate ND, respectively. Even if the first input is an unknown voltage, the NAND gate ND always outputs a logic 'high' signal as long as the second control signal CON2 is logic 'low'. That is, if the second control signal CON2 is logic 'low', then a path in which the output of the NAND gate ND is pulled down is always blocked without being influenced by the logic level of the first input. Thus, a static current path is not formed from a second power supply voltage VDD2 source to a ground voltage VSS source via the NAND gate ND. Accordingly, in the LCD system 1200 according to the current embodiment, leakage current does not flow through the at least one input buffer BUF_I even when supply of power to the memory 1216 is discontinued, thereby reducing power consumption.

The at least one input buffer BUF_I may further include an ESD protection unit 1219. The ESD protection unit 1219 prevents, for example, a gate oxide layer formed on the at least one input buffer BUF_I from being destroyed by static electricity. The ESD protection unit 1219 includes a first diode D1 connected between an input terminal N2 of the at least one input buffer BUF_I and the second power supply voltage VDD2 source, and a second diode D2 connected between the input terminal N2 and the ground voltage VSS source. The ESD protection unit 1219 may function as the ESD protection unit 1119 described above with reference to FIG. 11.

Figure 13:
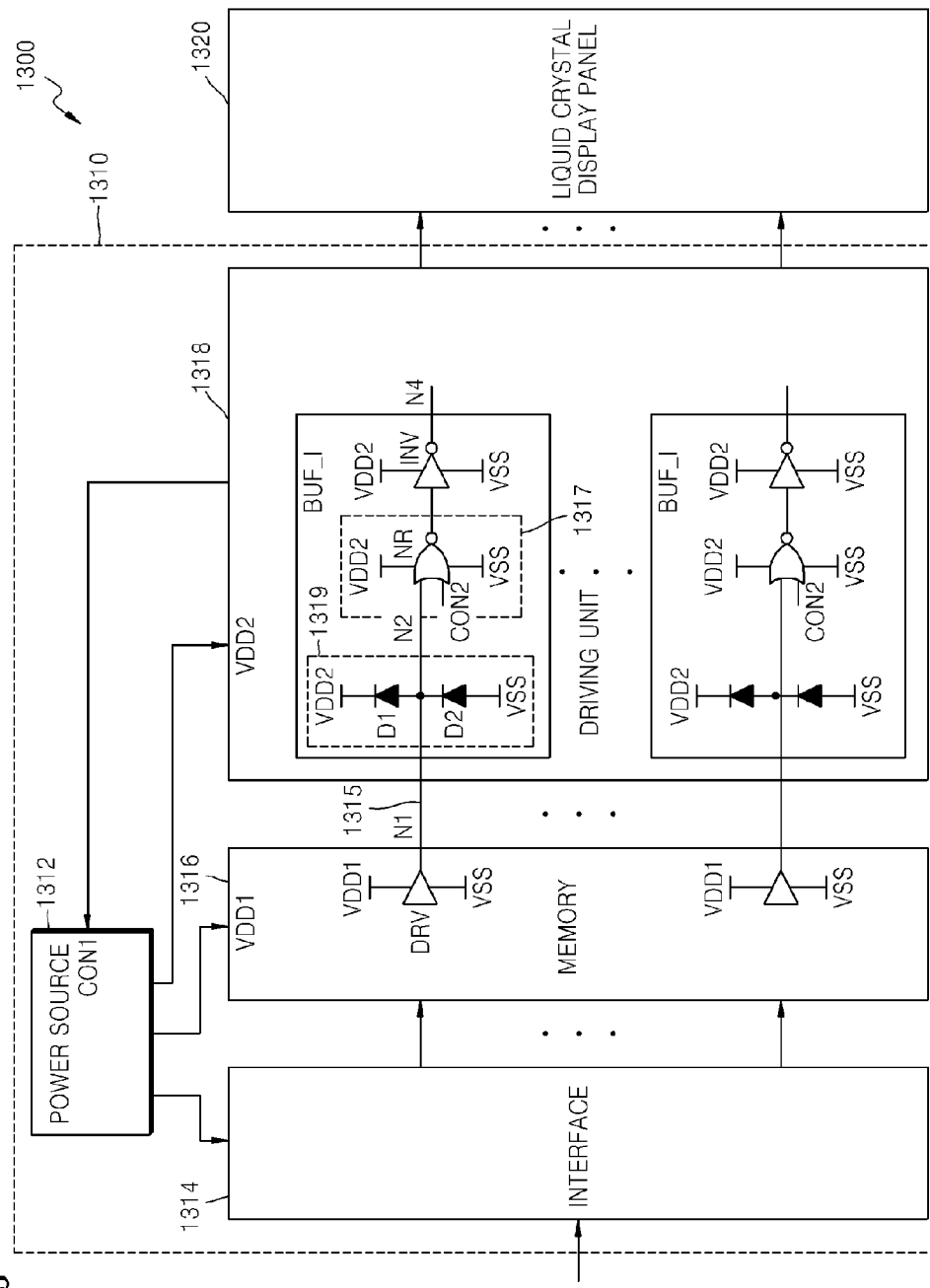
FIG. 13 is an exemplary block diagram of an LCD device according to yet another embodiment.

FIG. 13 is an exemplary block diagram of an LCD system 1300 according to another embodiment. Referring to FIG. 13, the LCD system 1300 includes at least one input buffer BUF_I including a current leakage prevention circuit, such as blocking unit 1317, and an inverter INV. The blocking unit 1317 prevents a current path from being formed between a second power supply voltage VDD2 source and the ground voltage VSS source regardless of a level of a voltage at the terminal N2 of the at least one input buffer BUF_I. The blocking unit 1317 may be a 2-input NOR gate NR. The NOR gate NR performs a NOR logical operation on a second control signal CON2 and a signal received from a transmission line 1315 and outputs the result. The inverter INV outputs an inversion of an output of the NOR gate NR.

In detail, a first control signal CON1 is set to logic 'high' in the first mode (normal mode) and to logic 'low' in the second mode (sleep mode). In the second mode, the power source 1312 does not provide the first power voltage VDD1 to the memory unit 1316. In other words, application of a first power supply voltage VDD1 to a memory 1316 is discontinued according to a first control signal CON1, then an output terminal N1 of at least one output driver DRV in the memory 1316 may be floated and is then in a Hi-Z state. Thus, in the second mode, the unknown voltage may be applied to the at least one input buffer BUF_I in the driving unit 1318 via the transmission line 1315. The output of the at least one output driver DRV and the second control signal CON2 are supplied as a first input and a second input to the NOR gate NR, respectively. Even if the first input is an unknown voltage, the NOR gate NR always outputs a logic 'low' signal as long as the second control signal CON2 is logic 'high'. That is, if the second control signal CON2 is logic 'high', a path in which an output of the NOR gate NR is pulled up is always blocked regardless of the logic level of the first input. Thus, a static current path is not formed from a second power supply voltage VDD2 source to a ground voltage VSS source via the NOR gate NR. Accordingly, in the LCD device 1300 according to the current embodiment, leakage current does not flow through the at least one input buffer BUF_I in the driving unit 1318 even when supply of power to the memory unit 1316 is discontinued, thereby reducing power consumption.

The at least one input buffer BUF_I may further include an ESD protection unit 1319. The ESD protection unit 1319 prevents, for example, a gate oxide layer formed on the at least one input buffer BUF_I from being destroyed by static electricity. The ESD protection unit 1319 includes a first diode D1 connected between an input terminal N2 of the at least one input buffer BUF_I and the second power supply voltage VDD2 source, and a second diode D2 connected between the input terminal N2 and the ground voltage VSS source. The ESD protection unit 1319 may function as described above with reference to FIG. 11.

While certain exemplary embodiments are described above, it will be understood that various changes in form and details may be made therein without departing from the spirit and scope of the following claims.

What is claimed is:

1. A liquid crystal display system comprising:
   a liquid crystal display panel in which a plurality of scan lines and a plurality of data lines intersect one another crosswise, where a switching unit and a pixel electrode are disposed at each of the intersections;
   a memory including at least one output driver being driven by a first power supply voltage in a first mode, for outputting image data stored in a cell via the at least one output driver, wherein the memory is configured to store data in the first mode and does not store data in a second mode;

a driving unit including at least one input buffer being driven by a second power supply voltage, the driving unit configured to receive data stored in the memory via the at least one input buffer, generate at least one gray-scale voltage signal corresponding to the received data, and sequentially supply the at least one gray-scale voltage signal to a respective at least one data line of the data lines of the liquid crystal panel; and a power source that provides the first power supply voltage to the memory and the second power supply voltage to the driving unit in the first mode and does not provide the first power supply voltage to the memory in the second mode, wherein the input buffer includes a circuit configured to prevent a current path from being formed between the second power supply voltage source and a ground voltage source in the second mode, and wherein an output terminal of the at least one output driver is connected to an input terminal of the at least one input buffer via a transmission line.

2. The liquid crystal display system of claim 1, wherein the at least one input buffer comprises:

a blocking unit that comprises the circuit, the blocking unit configured to block a current path between the second power supply voltage source and the ground voltage source regardless of a level of the voltage at the input terminal of the input buffer, according to a first control signal; and an inverter for inverting and outputting an output of the blocking unit.

3. The liquid crystal display system of claim 2, wherein the blocking unit comprises one of a NAND gate or a NOR gate to which a signal from the input terminal and the first control signal are supplied.

4. The liquid crystal display system of claim 3, wherein the input buffer further comprises:

a first diode, a cathode and anode of which are connected to the second power supply voltage source and the input terminal, respectively, the first diode for providing a static electricity discharge path for the second power supply voltage source; and a second diode, a cathode and anode of which are connected to the input terminal and the ground voltage source, respectively, the second diode for providing a static electricity discharge path for the ground voltage source.

5. The liquid crystal display system of claim 1, wherein the output driver is configured such that the first power supply voltage is applied in the first mode and is prevented from being applied in the second mode in response to a second control signal, the second control signal having a first logic level in the first mode and a second logic level opposite to the first logic level in the second mode.

6. The liquid crystal display system of claim 5, wherein, if the first mode is switched to the second mode, the first control signal transitions before the second control signal transitions, and wherein, if the second mode is switched to the first mode, the second control signal transitions before the first control signal transitions.

7. The liquid crystal display system of claim 1, wherein after the current path is prevented in response to a first control signal, the first power supply voltage is prevented from being applied to the output driver.

\* \* \* \* \*